United States Patent [19]

Gerzberg

[11] Patent Number: 4,590,589
[45] Date of Patent: May 20, 1986

[54] ELECTRICALLY PROGRAMMABLE READ ONLY MEMORY

[75] Inventor: Levy Gerzberg, Palo Alto, Calif.

[73] Assignees: Zoran Corporation, Santa Clara; International Microelectronic Products Corporation, San Jose, both of Calif.

[21] Appl. No.: 451,821

[22] Filed: Dec. 21, 1982

[51] Int. Cl.$^4$ .............................................. G11C 17/00
[52] U.S. Cl. ...................................... 365/100; 365/94; 357/51
[58] Field of Search ................. 365/94, 100, 103, 104; 357/29, 45, 51, 59, 91

[56] References Cited

U.S. PATENT DOCUMENTS

| | | | |
|---|---|---|---|
| 4,146,902 | 3/1979 | Tanimoto et al. | 357/51 |
| 4,174,521 | 11/1979 | Neale | 357/67 |
| 4,210,996 | 7/1980 | Amemiya et al. | 357/59 |
| 4,238,694 | 12/1980 | Kimerling et al. | 357/29 |
| 4,240,843 | 12/1980 | Celler et al. | 357/13 |
| 4,420,766 | 12/1983 | Kasten | 357/59 |
| 4,432,008 | 2/1984 | Maltiel | 357/51 |
| 4,442,507 | 4/1984 | Roesner | 357/59 |
| 4,476,478 | 10/1984 | Noguchi et al. | 357/59 |

OTHER PUBLICATIONS

Kato et al., "Electrical Trimming of Polycrystalline Silicon Resistors and its Applications to Analog IC's", IEEE Transactions on Electron Devices, vol. ED-27, No. 11, Nov. 1980, p. 2194.
Tanimoto et al., "A Novel MOS PROM Using a Highly Resistive Poly-Si Resistor", IEEE Transactions on Electron Devices, vol. ED-27, No. 3, Mar. 1980, p. 517.
Tanimoto et al., "A Novel 14V Programmable 4K Bit MOS PROM Using a Poly-Si Resistor Applicable to On-Chip Programmable Devices", IEEE Journal of Solid-State Circuits, vol. SC-17, No. 1, Feb. 1982, p. 62.
Pate et al., "Prom Needs Far Less Power Than Bipolar Counterparts", Electronics, Oct. 6, 1981, p. 124.
Kroger et al., "Memory Switching in Polycrystalline Silicon Films", Thin Solid Films, 66 (1980), pp. 171-176.
"Titanium-Tungsten Fuses Improve 16K PROMs", source unknown.
"Family Gains 16K RAMs, Schottky PROM Series", Electronics, May 5, 1981, p. 182.
"Thinner Design Rules Yield 55-ns 8K Prom", Electronics, May 5, 1981, p. 241.
HM-6641 Polysilicon Feasible Link, Harris Semiconductor Digital Products Division Products Specification, 1982.
Product Specification for Read Mostly Memories, Energy Conversion Devices, Inc.
"Bipolar PROM ACESSES in 70ns", Electronics, Mar. 10, 1982, pp. 184 and 186.
Wendt, "Isoplanar-Z Improves PROMs", Progress, vol. 10, No. 1, date unknown.
"ION Implantation of Neon in Silicon for Planar Amorphous Isolation", Electronics Letters, vol. 14, No. 15, Jul. 1978, pp. 460-462.

Primary Examiner—Joseph A. Popek
Attorney, Agent, or Firm—Flehr, Hohbach, Test, Albritton & Herbert

[57] ABSTRACT

A programmable read only memory (PROM) includes voltage programmable structures which are readily fabricated to provide predictable and selectable programming voltages. The resistor structure includes a body of semiconductor material having high electrical conductance and a surface contact region having a crystalline structure characterized by relatively high electrical resistance. The relatively high electrical resistance can be established by amorphizing the surface region or by forming lattice defects in the crystalline structure such as by ion implantation. In programming the PROM, a sufficient voltage is applied across, or sufficient current is applied through, selected structures whereby the surface regions thereof are heated sufficiently to reduce the relatively high electrical resistance.

6 Claims, 11 Drawing Figures

U.S. Patent  May 20, 1986  Sheet 1 of 3  4,590,589
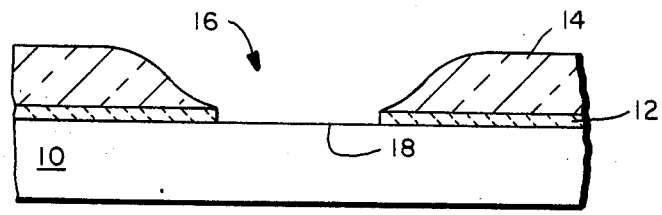
FIG.—1A
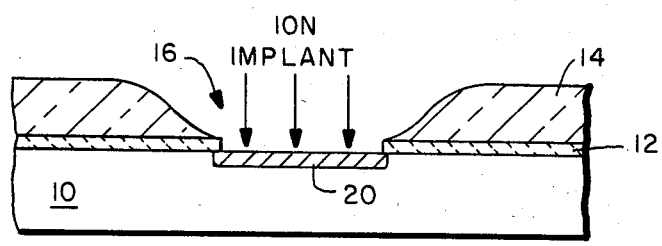
FIG.—1B
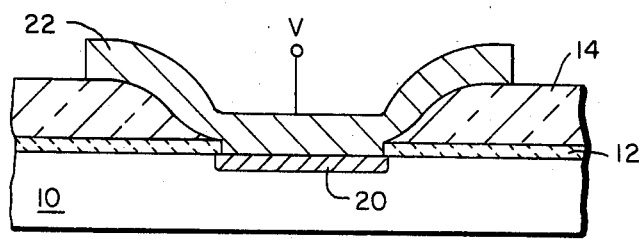
FIG.—1C
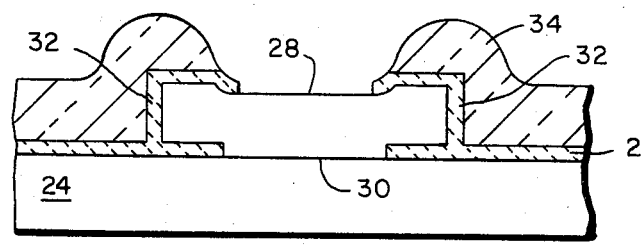
FIG.—2A
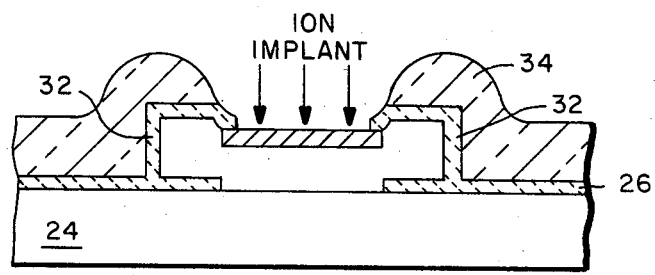
FIG.—2B
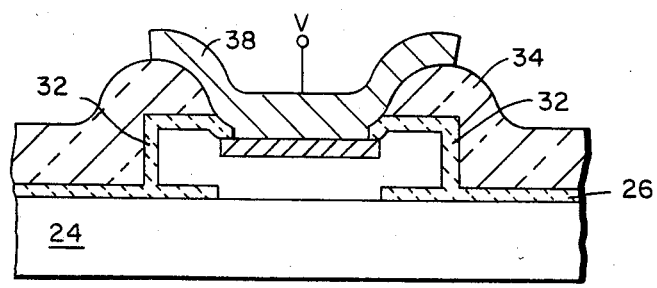
FIG.—2C

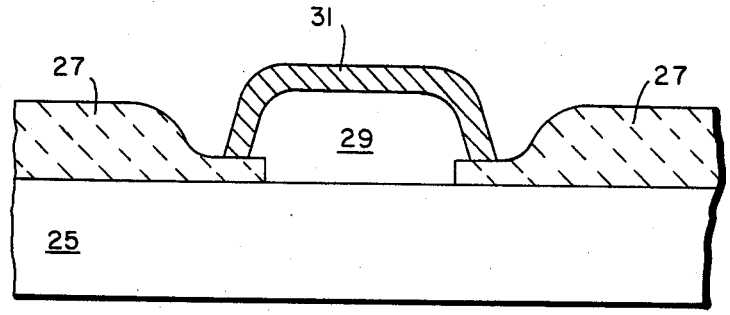
FIG.—3A
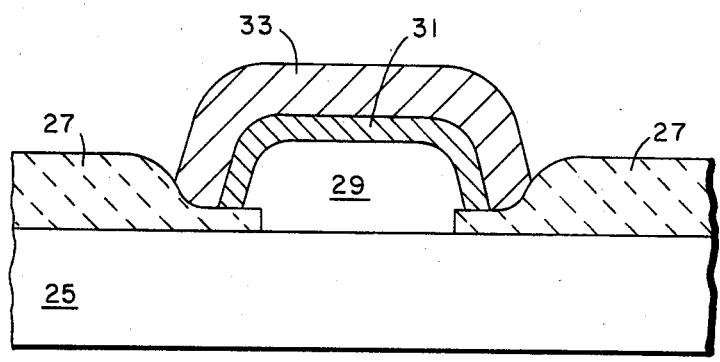
FIG.—3B
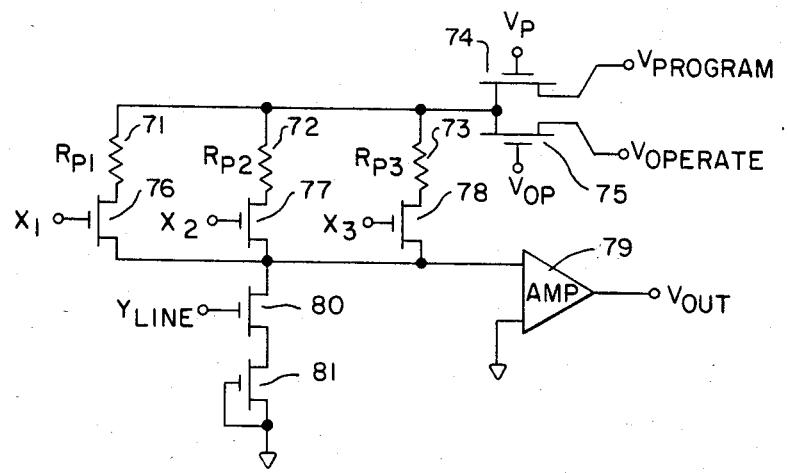
FIG.—5

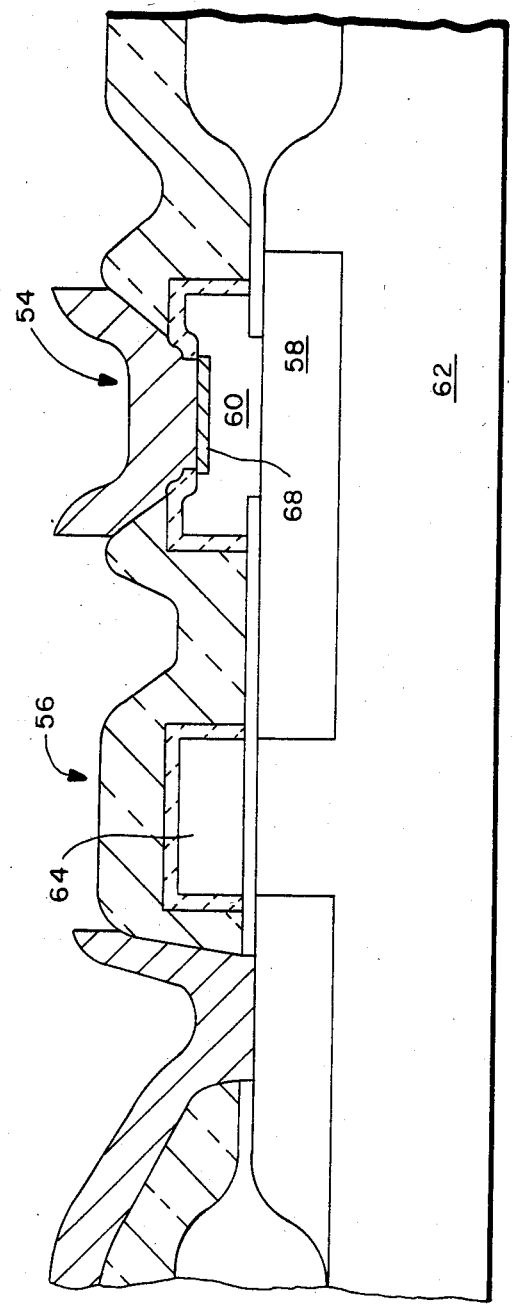
FIG.—4A
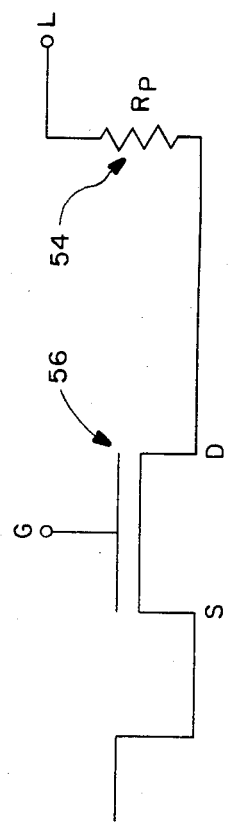
FIG.—4B

ELECTRICALLY PROGRAMMABLE READ ONLY MEMORY

This application is related to copending application Ser. No. 451,823, filed Dec. 21, 1982 by Levy Gerzberg for "Method and Structure for Selectively Interconnecting Electrical Circuit Elements".

This invention relates generally to semiconductor devices and technology, and more particularly the invention relates to read only memory devices which can be programmed electrically.

The ability to program a semiconductor read only memory (ROM), after fabrication thereof, is desirable. Known techniques for programming a ROM include the use of fusible conduction links which can be disrupted or melted by applying a surface voltage thereacross. Additionally, a radiation beam can be used for annealing doped polycrystalline material to thereby increase the conductivity thereof, as disclosed in U.S. Pat. No. 4,233,671 entitled "Read Only Memory and Integrated Circuit and Method of Programming by Laser Means".

Tanimoto et al, "A Novel 14V Programmable 4K Bit MOS PROM Using a Poly-SI Resistor Applicable to On-Chip Programmable Devices", IEEE Journal of Solid State Circuits, Vol. SC-17, No. 1, February 1982, pgs. 62–68 discloses a highly resistive poly-si resistor as a fusible link in a programmable memory. The resistor employs a thin undoped polysilicon layer between two highly doped polysilicon layers with the undoped polysilicon layer having a critical thickness obtained by optimizing the deposition conditions for the undoped layer. The highly resistive, undoped polycrystalline silicon makes an irreversible resistivity transition to a low resistive state by applying a transition voltage across the highly doped layers. Fabrication of the device requires critical process control in forming the undoped polycrystalline layer and in controlling dopant diffusion from the highly doped layers.

The present invention is directed to a semiconductor read only memory ROM which uses a predictable and selectable programming voltage. The device is readily fabricated by simple modification of existing semiconductor device fabrication processes. Only one additional masking step and one implantation step is required. High density is achieved, and the programmable elements can be placed above an area of a semiconductor chip which has other functional areas therein. Importantly, the programming voltages are independent of the deposition conditions employed in fabricating the device.

Accordingly, an object of the invention is an improved programmable semiconductor read only memory device (PROM).

Another object of the invention is an improved method of programming a read only memory device.

Still another object of the invention is a programmable read only memory which can be tested prior to programming to verify that the device is acceptable.

A feature of the invention is a highly conductive semiconductor material having a contact surface characterized by high resistance formed by crystal lattice disruptions or by amorphotizing the surface layer.

Another feature of the invention is the use of a programming voltage sufficient to cause localized heating of the contact surface for recrystallizing the amorphotized region and annealing the lattice disruptions.

The invention and objects and features thereof will be more readily apparent from the following detailed description and appended claims when taken with the drawing, in which:

FIGS. 1A–1C are section views of a portion of a semiconductor structure illustrating the fabrication of a contact structure useful in practicing the invention.

FIGS. 2A–2C are section views of a portion of a semiconductor structure illustrating the fabrication of a contact structure in accordance with another embodiment useful in practicing the invention.

FIGS. 3A and 3B are section views illustrating another embodiment of a contact structure.

FIG. 4A and FIG. 4B are a section view of a circuit structure and the electrical schematic thereof, respectively, in accordance with the invention.

FIG. 5 is an electrical schematic of a PROM in accordance with the present invention.

Referring now to the drawing, FIGS. 1A–1C are section views of a semiconductor body illustrating the steps of fabricating a programmable device for a PROM in accordance with one embodiment of the invention. In FIG. 1A a semiconductor 10 substrate is doped to provide a desired low resistance conduction path. The semiconductor body may be polycrystalline or single crystalline silicon, for example, and a silicon oxide layer 12 is formed on one surface thereof. A second layer of silicon oxide 14, for example field oxide, may be provided on the silicon oxide layer 12. By conventional photoresist masking and chemical etching techniques a window shown generally at 16 is formed through the silicon oxide layers thereby exposing a limited surface 18 of the substrate 10.

In FIG. 1B ions are directed through the window 16 and implanted in surface region 20 abutting the exposed surface area 18. The ions may be P type conductivity such as boron or N type conductivity such as phosphorous or noble element such as Argon or semiconductor such as silicon, and the depth of the implanted ions is readily controlled by voltage of the ion source. As is well known in the art, the implantation of ions in a semiconductor body disrupts the crystalline structure of the silicon thereby increasing the electrical resistance thereof. In one embodiment Argon ions are implanted at an energy of 180 kev and a dose of $8 \times 10^{15}$ ions cm$^{-2}$ into a single crystalline silicon substrate having a dopant concentration of $10^{21}$ atoms cm$^{-3}$ and the resulting resistance of the implanted region was $8 \times 10^7$ ohms as compared to the 500Ω ohms resistance of the substrate. As shown in FIG. 1C, a metal contact 22 of sputtered aluminum-silicon, titanium-tungsten, or a metal silicide, for example, is formed over the oxide layer 14 and in contact with the surface 18 of substrate 10.

By restricting the operating voltage applied to the contact 22, the resistance of the surface region 20 remains at $8 \times 10^7$ ohms. However, by increasing the voltage applied to contact 22, the surface region 20 can be heated sufficiently to reduce the relatively high resistance thereof. In the embodiment described above, a normal operating voltage of 5 volts will not affect the $8 \times 10^7$ ohm resistance of the surface region 20. However, by increasing the voltage to 12 volts, the resistance of the surface region 20 is reduced to 500 ohms. Accordingly, a very high resistance structure can be converted to a low resistance conductor by selectively applying a voltage thereacross which generates sufficient heat to convert the crystalline structure of the surface region. The procedure may result in annealing the lattice defects or in recrystallizing fine grain or amorphous semiconductor material thus forming larger grain polycrystalline semiconductor material.

Advantageously, the PROM structure can be formed either in a semiconductor substrate, as shown in FIGS. 1A–1C, the structure can be formed on the surface of a semiconductor substrate as illustrated in the section views of a semiconductor structure illustrated in FIGS. 2A–2C. Referring to FIG. 2A, a silicon substrate 24 having a dopant concentration of $5 \times 10^{15}$ a atoms cm$^{-3}$ and a resistivity of 1 ohm-cm has a silicon oxide layer 26 formed thereon and a low resistivity polycrystalline silicon layer 28 formed over the silicon oxide layer 26 and in contact with a surface region 30 of the substrate. Surface portions of the polycrystalline silicon layer 28 may be oxidized as shown at 32 and a field oxide 34 may be formed thereon.

As shown in FIG. 2B ions are then implanted into a surface region 36 in the polycrystalline silicon 28 thereby disrupting the crystalline structure and increasing the resistance thereof. Finally, as shown in FIG. 2C a metal contact 38 is formed on the surface of the silicon oxide layer 34 and in contact with the surface 30 and underlying surface region 36. Again, a voltage potential can be applied across surface region 36 by voltage biasing the contact 38 and substrate 24, as illustrated. By limiting the operating voltage potential across the surface region 36 the high resistance thereof is unaffected. However, by increasing the voltage sufficiently, the surface region 36 is heated sufficiently to recrystallize the structure and thereby reduce the resistance of the structure. Alternatively, the heating can be limited whereby the dopant is activated but no recrystallization occurs.

FIGS. 3A and 3B are section views illustrating an embodiment similar to FIG. 2C. In FIG. 3A, a substrate 25 of low resistivity silicon has a silicon oxide layer 27 form on a major surface, and a polycrystalline silicon material 29 is formed in contact with substrate 25 through an opening in layer 27. The entire exposed surface region 31 of material 29 is converted to high resistivity material by ion implantation, as described above. Thereafter, as shown in FIG. 3B a metal layer 33 is formed over the structure in contact with the high resistivity surface region 31.

FIGS. 4A and 4B are a section view of a semiconductor structure and electrical schematic, respectively, in which a programmable resistor 54 is interconnected with the drain of a MOS field effect transistor 56. The resistor 54, similar in construction to the device illustrated in FIGS. 2A–2C, is interconnected to the drain of transistor 56 through the N+ region 58. The polycrystalline silicon material 60 of the resistor is formed on the substrate 62 during the processing step for forming the polysilicon gate 64 of the transistor. Thereafter, the ion implantation for forming region 68 requires only one additional masking step (to open the window for ion implantation) and then the step of implanting the high resistivity region 68. All other steps are identical to a conventional MOS fabrication process. After fabrication of the device, programming may be done simply by applying sufficient voltage across the resistor to redefine the crystalline structure and thereby reduce the resistive value thereof.

FIG. 5 is a schematic of a PROM in accordance with the invention having the structures 71, 72, and 73 which are interconnected in parallel through transistor 74 to a programming voltage, $V_{program}$, and through the transistor 75 to an operating voltage, $V_{operate}$. The resistors 71–73 are connected through transistors 76–78 to one input of a sensing amplifier 79. The amplifier input is also connected through Y address transistor 80 and load transistor 81 to circuit ground. Thus, by selectively programming the resistors 71–73, any or all of inputs X1, X2, and X3 to transistors 76–78 will create a one output from amplifier 79 when the respective X and Y lines are addressed. To program the devices 71–73, the programming transistor 74 is turned on thereby applying the $V_{program}$ voltage to all of the structures 71–73. Then by selectively turning on transistors 76–78 and transistor 80 the programming voltage converts the high resistivity of the selected devices to low resistivity.

Advantageously, the programmable resistor structures of the PROM can be tested prior to programming to verify the acceptability of the PROM device. Acceptable resistor structures will have a resistance within specified ranges for different voltage levels prior to programming. Should any structures fail to have the requisite resistance, the device can be discarded.

The embodiments described hereinabove are illustrative of the invention and applications thereof. While the invention has been described with reference to specific embodiments, the description is illustrative of the invention and is not to be construed as the invention. Various modifications and applications may occur to those skilled in the art without departing from the true spirit and scope of the invention as defined by the appended claims.

What is claimed is:

1. A programmable read only memory device comprising a plurality of active and passive circuit elements forming a memory cell, a plurality of voltage programmable resistor structures interconnecting said plurality of active and passive circuit elements, each of said programmable structures comprising a body of doped semiconductor material the bulk of which is characterized by first electrical conductance, said body having a contact surface and including a doped surface region abutting said contact surface, said doped surface region having a material structure characterized by a second electrical conductance lower than said first electrical conductance, electrical contact means engaging said contact surface, variable voltage means interconnected to said electrical contact means for applying an operating voltage to said voltage programmable resistor structures which does not affect the electrical characteristics of said doped surface region and for applying a programming voltage of greater magnitude than said operating voltage which increases said second electrical conductance in a magnitude closer to said first electrical conductance, and address means for addressing and reading said memory device.

2. A programmable read only memory device as defined by claim 1 wherein said material structure of said surface region includes crystal lattice disruptions.

3. A programmable read only memory device as defined by claim 1 wherein said material structure of said surface region includes fine crystalline grain semiconductor material.

4. A programmable read only memory as defined by claim 1 wherein said device comprises a semiconductor substrate and said programmable resistor structures are formed in said substrate.

5. A programmable read only memory as defined by claim 1 wherein said device comprises a semiconductor substrate and at least some of said plurality of voltage programmable resistor structures are formed on the surface of said substrate.

6. A programmable read only memory device as defined by claim 1 wherein said material structure of said surface region includes amorphous semiconductor material.

* * * * *